(12) United States Patent
Yedinak et al.

(10) Patent No.: US 8,227,855 B2
(45) Date of Patent: Jul. 24, 2012

(54) SEMICONDUCTOR DEVICES WITH STABLE AND CONTROLLED AVALANCHE CHARACTERISTICS AND METHODS OF FABRICATING THE SAME

(75) Inventors: Joseph Yedinak, Mountaintop, PA (US); Mark Rinehimer, Mountaintop, PA (US); Thomas E. Grebs, Mountaintop, PA (US); John Benjamin, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 353 days.

(21) Appl. No.: 12/368,210

(22) Filed: Feb. 9, 2009

(65) Prior Publication Data

US 2010/0200910 A1    Aug. 12, 2010

(51) Int. Cl.
*H01L 29/78* (2006.01)
(52) U.S. Cl. . 257/328; 257/623; 257/476; 257/E29.262; 257/E21.41; 257/330; 257/333; 257/471; 257/475; 257/329; 257/481; 257/480; 257/482; 257/656
(58) Field of Classification Search .................. 257/328, 257/623, 476, E29.262, E21.41, 475, 471, 257/480, 482, 656, 330, 333, 329; 438/589
See application file for complete search history.

(56) References Cited

U.S. PATENT DOCUMENTS

| | | |
|---|---|---|
| 4,641,174 A | 2/1987 | Baliga |
| 4,697,201 A | 9/1987 | Mihara |
| 4,767,722 A | 8/1988 | Blanchard |
| 4,796,070 A | 1/1989 | Black |
| 4,876,579 A | 10/1989 | Davis et al. |
| 4,881,105 A | 11/1989 | Davari et al. |
| 4,893,160 A | 1/1990 | Blanchard |
| 4,914,058 A | 4/1990 | Blanchard |
| 4,941,026 A | 7/1990 | Temple |
| 4,942,445 A | 7/1990 | Baliga et al. |
| 4,954,854 A | 9/1990 | Dhong et al. |
| 4,974,059 A | 11/1990 | Kinzer |
| 4,982,260 A | 1/1991 | Chang et al. |
| 4,994,883 A | 2/1991 | Chang et al. |
| 5,028,548 A | 7/1991 | Nguyen |
| 5,034,341 A | 7/1991 | Itoh |
| 5,072,266 A | 12/1991 | Bulucea et al. |
| 5,077,228 A | 12/1991 | Eklund et al. |
| 5,101,244 A | 3/1992 | Mori et al. |
| 5,119,153 A | 6/1992 | Korman et al. |
| 5,126,807 A | 6/1992 | Baba et al. |
| 5,216,275 A | 6/1993 | Chen |
| 5,233,215 A | 8/1993 | Baliga |
| 5,241,195 A | 8/1993 | Tu et al. |
| 5,262,336 A | 11/1993 | Pike, Jr. et al. |
| 5,321,289 A | 6/1994 | Baba et al. |
| 5,346,835 A | 9/1994 | Malhi et al. |
| 5,365,102 A * | 11/1994 | Mehrotra et al. ............. 257/475 |
| 5,393,998 A | 2/1995 | Ishii et al. |
| 5,424,563 A | 6/1995 | Temple et al. |
| 5,430,324 A | 7/1995 | Bencuya |

(Continued)

FOREIGN PATENT DOCUMENTS

WO    WO 2006-135746 A2    12/2006

(Continued)

*Primary Examiner* — Marc Armand

(57) ABSTRACT

Disclosed are semiconductor devices with breakdown voltages that are more controlled and stable after repeated exposure to breakdown conditions than prior art devices. The disclosed devices can be used to provide secondary circuit functions not previously contemplated by the prior art.

35 Claims, 6 Drawing Sheets

U.S. PATENT DOCUMENTS

| | | | |
|---|---|---|---|
| 5,434,435 A * | 7/1995 | Baliga | 257/141 |
| 5,471,075 A * | 11/1995 | Shekar et al. | 257/139 |
| 5,508,534 A | 4/1996 | Nakamura et al. | |
| 5,510,634 A | 4/1996 | Okabe et al. | |
| 5,528,058 A | 6/1996 | Pike, Jr. et al. | |
| 5,541,425 A | 7/1996 | Nishihara | |
| 5,541,430 A | 7/1996 | Terashima | |
| 5,545,915 A | 8/1996 | Disney et al. | |
| 5,557,127 A | 9/1996 | Ajit et al. | |
| 5,567,635 A | 10/1996 | Acovic et al. | |
| 5,578,851 A | 11/1996 | Hshieh et al. | |
| 5,589,405 A | 12/1996 | Contiero et al. | |
| 5,597,765 A | 1/1997 | Yilmaz et al. | |
| 5,602,046 A | 2/1997 | Calafut et al. | |
| 5,605,852 A | 2/1997 | Bencuya | |
| 5,607,875 A | 3/1997 | Nishizawa et al. | |
| 5,637,898 A | 6/1997 | Baliga | |
| 5,639,676 A | 6/1997 | Hshieh et al. | |
| 5,644,150 A | 7/1997 | Iwamuro | |
| 5,665,996 A | 9/1997 | Williams et al. | |
| 5,777,362 A | 7/1998 | Pearce | |
| 5,807,783 A | 9/1998 | Gaul et al. | |
| 5,814,858 A | 9/1998 | Williams | |
| 5,828,101 A | 10/1998 | Endo | |
| 5,856,692 A | 1/1999 | Williams et al. | |
| 5,859,446 A | 1/1999 | Nagasu et al. | |
| 5,877,528 A | 3/1999 | So | |
| 5,877,538 A | 3/1999 | Williams | |
| 5,894,149 A | 4/1999 | Uenishi et al. | |
| 5,920,108 A | 7/1999 | Hemmenway et al. | |
| 5,932,897 A | 8/1999 | Kawaguchi et al. | |
| 5,949,124 A | 9/1999 | Hadizad et al. | |
| 5,972,741 A | 10/1999 | Kubo et al. | |
| 5,973,368 A | 10/1999 | Pearce et al. | |
| 5,998,822 A | 12/1999 | Wada | |
| 6,020,270 A | 2/2000 | Wong et al. | |
| 6,049,108 A | 4/2000 | Williams et al. | |
| 6,051,468 A | 4/2000 | Hshieh | |
| 6,060,744 A | 5/2000 | Kuwahara et al. | |
| 6,078,090 A | 6/2000 | Williams et al. | |
| 6,104,054 A | 8/2000 | Corsi et al. | |
| 6,110,763 A | 8/2000 | Temple | |
| 6,130,458 A | 10/2000 | Takagi et al. | |
| 6,137,152 A | 10/2000 | Wu | |
| 6,140,680 A | 10/2000 | Pulvirenti | |
| 6,168,996 B1 | 1/2001 | Numazawa et al. | |
| 6,174,773 B1 | 1/2001 | Fujishima | |
| 6,188,104 B1 | 2/2001 | Choi et al. | |
| 6,188,105 B1 | 2/2001 | Kocon et al. | |
| 6,191,447 B1 * | 2/2001 | Baliga | 257/330 |
| 6,208,185 B1 | 3/2001 | John et al. | |
| 6,242,787 B1 | 6/2001 | Nakayama et al. | |
| 6,252,277 B1 | 6/2001 | Chan et al. | |
| 6,259,136 B1 | 7/2001 | Kawaguchi et al. | |
| 6,262,439 B1 | 7/2001 | Takeuchi et al. | |
| 6,274,437 B1 | 8/2001 | Evans | |
| 6,274,905 B1 | 8/2001 | Mo | |
| 6,316,280 B1 | 11/2001 | Fujiwara | |
| 6,337,499 B1 | 1/2002 | Werner | |
| 6,362,026 B2 | 3/2002 | Zeng et al. | |
| 6,365,462 B2 | 4/2002 | Baliga | |
| 6,376,878 B1 | 4/2002 | Kocon | |
| 6,384,955 B2 | 5/2002 | Tada et al. | |
| 6,388,286 B1 | 5/2002 | Baliga | |
| 6,392,290 B1 | 5/2002 | Kasem et al. | |
| 6,396,102 B1 | 5/2002 | Calafut | |
| 6,437,386 B1 | 8/2002 | Hurst et al. | |
| 6,437,419 B1 | 8/2002 | Bhalla et al. | |
| 6,445,035 B1 | 9/2002 | Zeng et al. | |
| 6,459,113 B1 | 10/2002 | Morihara et al. | |
| 6,461,918 B1 | 10/2002 | Calafut | |
| 6,465,325 B2 | 10/2002 | Ridley et al. | |
| 6,482,681 B1 | 11/2002 | Francis et al. | |
| 6,492,663 B1 | 12/2002 | Blanchard | |
| 6,514,857 B1 | 2/2003 | Naik et al. | |
| 6,534,825 B2 | 3/2003 | Calafut | |
| 6,548,317 B2 | 4/2003 | Taniguchi et al. | |
| 6,573,558 B2 | 6/2003 | Disney | |
| 6,573,569 B2 | 6/2003 | Hao et al. | |
| 6,586,800 B2 | 7/2003 | Brown | |
| 6,602,768 B2 | 8/2003 | Kocon et al. | |
| 6,620,653 B2 | 9/2003 | Matsudai et al. | |
| 6,624,472 B2 | 9/2003 | Hurkx et al. | |
| 6,635,535 B2 | 10/2003 | Hao et al. | |
| 6,638,826 B2 | 10/2003 | Zeng et al. | |
| 6,653,161 B1 | 11/2003 | Morse | |
| 6,653,740 B2 | 11/2003 | Kinzer et al. | |
| 6,673,680 B2 | 1/2004 | Calafut | |
| 6,673,681 B2 | 1/2004 | Kocon et al. | |
| 6,677,626 B1 | 1/2004 | Shindou et al. | |
| 6,680,232 B2 | 1/2004 | Grebs et al. | |
| 6,683,346 B2 | 1/2004 | Zeng | |
| 6,683,363 B2 | 1/2004 | Challa | |
| 6,690,062 B2 | 2/2004 | Henninger et al. | |
| 6,696,726 B1 | 2/2004 | Bencuya et al. | |
| 6,696,728 B2 | 2/2004 | Onishi et al. | |
| 6,700,158 B1 | 3/2004 | Cao et al. | |
| 6,710,406 B2 | 3/2004 | Mo et al. | |
| 6,724,042 B2 | 4/2004 | Onishi et al. | |
| 6,734,497 B2 | 5/2004 | Takahashi et al. | |
| 6,750,508 B2 | 6/2004 | Omura et al. | |
| 6,777,747 B2 | 8/2004 | Yedinak et al. | |
| 6,798,019 B2 | 9/2004 | Yedinak et al. | |
| 6,802,719 B2 | 10/2004 | Finney | |
| 6,803,626 B2 | 10/2004 | Sapp et al. | |
| 6,809,375 B2 | 10/2004 | Takemori et al. | |
| 6,818,947 B2 | 11/2004 | Grebs et al. | |
| 6,825,510 B2 | 11/2004 | Probst | |
| 6,828,195 B2 | 12/2004 | Mo et al. | |
| 6,831,329 B2 | 12/2004 | Yedinak et al. | |
| 6,838,722 B2 | 1/2005 | Bhalla et al. | |
| 6,844,592 B2 | 1/2005 | Yamaguchi et al. | |
| 6,861,701 B2 | 3/2005 | Williams et al. | |
| 6,906,362 B2 | 6/2005 | Yedinak et al. | |
| 6,916,745 B2 | 7/2005 | Herrick et al. | |
| 6,979,874 B2 | 12/2005 | Harada | |
| 6,982,459 B2 | 1/2006 | Suzuki et al. | |
| 7,005,351 B2 | 2/2006 | Henninger et al. | |
| 7,064,385 B2 | 6/2006 | Dudek et al. | |
| 7,078,296 B2 | 7/2006 | Chau et al. | |
| 7,091,573 B2 | 8/2006 | Hirler et al. | |
| 7,118,951 B2 | 10/2006 | Yedinak et al. | |
| 7,132,712 B2 | 11/2006 | Kocon et al. | |
| 7,148,111 B2 | 12/2006 | Mo et al. | |
| 7,170,119 B2 | 1/2007 | Yamauchi et al. | |
| 7,250,343 B2 | 7/2007 | Kotek et al. | |
| 7,319,256 B1 | 1/2008 | Kraft et al. | |
| 7,344,943 B2 | 3/2008 | Herrick et al. | |
| 7,345,342 B2 | 3/2008 | Challa et al. | |
| 7,352,036 B2 | 4/2008 | Grebs et al. | |
| 7,382,019 B2 | 6/2008 | Marchant et al. | |
| 7,385,248 B2 | 6/2008 | Herrick et al. | |
| 7,393,749 B2 | 7/2008 | Yilmaz et al. | |
| 7,416,948 B2 | 8/2008 | Kraft et al. | |
| 7,436,021 B2 | 10/2008 | Hao et al. | |
| 7,446,374 B2 | 11/2008 | Thorup et al. | |
| 7,449,354 B2 | 11/2008 | Marchant et al. | |
| 7,476,589 B2 | 1/2009 | Grebs et al. | |
| 7,485,532 B2 | 2/2009 | Marchant et al. | |
| 7,504,303 B2 | 3/2009 | Yilmaz et al. | |
| 7,504,306 B2 | 3/2009 | Sapp et al. | |
| 7,511,339 B2 | 3/2009 | Mo et al. | |
| 7,514,322 B2 | 4/2009 | Yilmaz et al. | |
| 7,521,773 B2 | 4/2009 | Yilmaz et al. | |
| 7,560,771 B2 | 7/2009 | Nakamura et al. | |
| 7,582,519 B2 | 9/2009 | Kocon et al. | |
| 7,595,524 B2 | 9/2009 | Herrick et al. | |
| 7,595,542 B2 | 9/2009 | Park | |
| 7,598,144 B2 | 10/2009 | Herrick et al. | |
| 7,612,408 B2 | 11/2009 | Zundel et al. | |
| 7,625,793 B2 | 12/2009 | Calafut | |
| 7,625,799 B2 | 12/2009 | Yilmaz et al. | |
| 7,638,841 B2 | 12/2009 | Challa | |
| 2005/0161735 A1 | 7/2005 | Aoki et al. | |
| 2005/0167742 A1 | 8/2005 | Challa et al. | |
| 2005/0181564 A1 | 8/2005 | Hshieh et al. | |
| 2005/0224848 A1 | 10/2005 | Kurosaki et al. | |

| | | | | | | |
|---|---|---|---|---|---|---|
| 2005/0242411 | A1 | 11/2005 | Tso | 2007/0069324 A1 | 3/2007 | Takaishi |
| 2006/0267088 | A1 | 11/2006 | Sharp et al. | 2007/0181927 A1 | 8/2007 | Yedinak et al. |
| 2006/0267090 | A1 | 11/2006 | Sapp et al. | 2008/0085591 A1 * | 4/2008 | Gomez et al. ............... 438/585 |
| 2006/0273386 | A1 | 12/2006 | Yilmaz et al. | | | |
| 2006/0289929 | A1 | 12/2006 | Andrews | | | |
| 2007/0001230 | A1 | 1/2007 | Lee et al. | | | |
| 2007/0029597 | A1 | 2/2007 | Lee et al. | | | |
| 2007/0032020 | A1 | 2/2007 | Grebs et al. | | | |

FOREIGN PATENT DOCUMENTS

WO    WO 2007-002857 A2    1/2007

* cited by examiner

SEMICONDUCTOR DEVICES WITH STABLE AND CONTROLLED AVALANCHE CHARACTERISTICS AND METHODS OF FABRICATING THE SAME

BACKGROUND OF THE INVENTION

The present invention relates in general to semiconductor technology, and in particular to power semiconductor devices and methods of manufacturing the same.

Several types of power semiconductor devices, such as transistors and diodes, comprise vertical devices. A vertical device generally comprises a mesa structure formed in a semiconductor epitaxial layer of a semiconductor substrate, where the mesa is defined by one or more trenches disposed in the epitaxial layer and around the mesa. A controllable current flows from the mesa's top to the mesa's bottom, in a direction that is generally perpendicular (e.g., vertical) to the surfaces of the epitaxial layer and semiconductor substrate. The vertical device typically has an ON-state where the current flows through the mesa with a low amount of electrical resistance, and an OFF-state where the current flow is substantially suppressed, except for a very small leakage current. In the OFF-state, the voltage that can be sustained through the mesa while suppressing current flow can be very high, such as in the range of several tens of volts. However, due to various processes occurring in the semiconductor material, such as carrier avalanche, the ability to suppress the current flow in the OFF-state fails at a certain level of voltage, which is often called the breakdown voltage.

The power semiconductor art generally views this breakdown as a detrimental effect that should be avoided during the operation of the device. Great effort is spent on designing power semiconductor devices to increase their breakdown voltages while maintaining low levels of ON-state resistance. The circuit design art generally teaches circuit designers to avoid exposing semiconductor devices to breakdown conditions, and to select devices that have breakdown voltages substantially greater than the voltage levels that the devices will encounter during circuit operation. Exposing a conventional power semiconductor device to repeated breakdown conditions often leads to changes in its electrical characteristics, and sometimes to the destruction of the device.

BRIEF SUMMARY OF THE INVENTION

As explained in greater detail below, the present invention is directed to providing semiconductor devices with breakdown voltages that are more controlled and stable after repeated exposure to breakdown conditions than prior art devices, and to thereby enable such semiconductor devices to provide secondary circuit functions not previously contemplated by the prior art. More specifically, the present invention is directed to features that make the breakdown voltages of semiconductor devices more controlled and stable over time after repeated exposure to breakdown conditions.

Accordingly, a first general exemplary embodiment according to the invention is directed to a semiconductor device broadly comprising a semiconductor layer of a first conductivity type having a first surface, a second surface, and a mesa region, with the mesa region having a top surface adjacent to the layer's first surface, a width, and a net doping concentration of the first conductivity type in a center portion of the mesa region. The product of the width and the net doping concentration is equal to or less than $2.4 \times 10^{12}$ cm$^{-2}$. The exemplary semiconductor device further comprises an electrically insulated electrode disposed in the semiconductor layer and adjacent to the mesa region, with the electrically insulated electrode extending from the layer's first surface toward the layer's second surface, and having at least one side wall and a bottom wall. The exemplary semiconductor device further comprises a second electrode disposed adjacent to the top surface of the mesa region, and a third electrode electrically coupled to the semiconductor layer. The first conductivity type may be n-type or p-type.

A second general exemplary embodiment according to the invention is directed to a semiconductor device broadly comprising a semiconductor layer of a first conductivity type having a first surface, a second surface, a mesa region, and a first net doping concentration of the first conductivity type in a center portion of the mesa region, with the mesa region having a top surface adjacent to the layer's first surface. The exemplary semiconductor device further comprises an electrically insulated electrode disposed in the semiconductor layer and adjacent to the mesa region, with the electrically insulated electrode extending from the layer's first surface toward the layer's second surface, and having at least one side wall and a bottom wall. The exemplary semiconductor device further comprises a second electrode disposed adjacent to the top surface of the mesa region, a third electrode electrically coupled to the semiconductor layer, and an enhanced doping region disposed in the semiconductor layer. The enhanced doping region is disposed adjacent to the bottom wall of the electrically insulated conductor, and has a second net doping concentration of the first conductivity type that is greater than the first net doping concentration of the first conductivity type. The first conductivity type may be n-type or p-type.

Aspects of the first and second general exemplary embodiments may be used alone or in combination.

A third general exemplary embodiment according to the invention is directed to a method of manufacturing a semiconductor device broadly comprising: forming one or more trenches into a semiconductor layer to define a mesa region having a width, the semiconductor layer having a net dopant concentration of a first conductivity type in a center portion of the mesa region, the product of the width and the net dopant concentration being equal to or less than $2.4 \times 10^{12}$ cm$^{-2}$; forming a thin dielectric layer on the side and bottom walls of the one or more trenches; and filling the one or more trenches with conductive material. The first conductivity type may be n-type or p-type.

A fourth general exemplary embodiment according to the invention is directed to a method of manufacturing a semiconductor device broadly comprising: forming one or more trenches into a semiconductor layer to define a mesa region having a width, each trench having a bottom wall and one or more side walls; implanting a dopant of a first conductivity type into the semiconductor layer at a location of at least one bottom wall of a trench; forming a thin dielectric layer on the side and bottom walls of the one or more trenches; and filling the one or more trenches with conductive material. The first conductivity type may be n-type or p-type.

Aspects of the third and fourth general exemplary embodiments may be used alone or in combination.

These and other embodiments of the invention are described in detail in the Detailed Description with reference to the Figures.

DETAILED DESCRIPTION OF THE INVENTION

Figure 1:
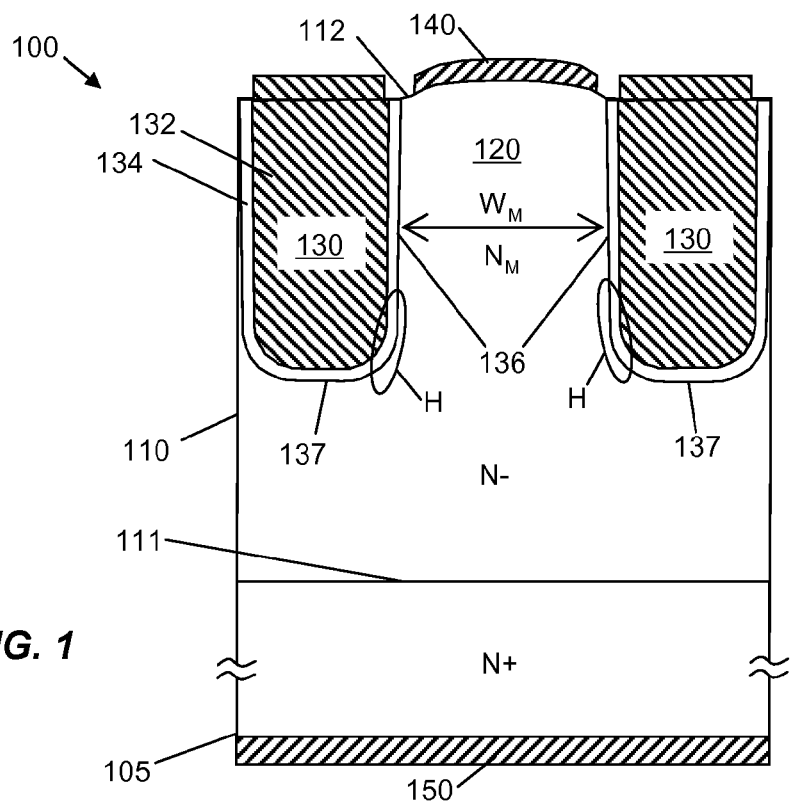
FIG. 1 is a cross sectional view of a first exemplary embodiment of a semiconductor device according to the present invention.

The techniques in accordance with the present invention will be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure is thorough and complete and fully conveys the scope of the invention to one skilled in the art. In the drawings, the thicknesses of layers and regions may be exaggerated for clarity. The same reference numerals are used to denote the same elements throughout the specification.

It will be understood that when an element, such as a layer, a region, an electrode, etc., is referred to as being "over," "on," "connected to," "coupled to," "electrically coupled to," etc. another element, it may be directly over, on, connected to, or coupled to the other element or intervening elements may be present. In contrast, when an element is referred to as being "directly on," "directly connected to," "directly coupled to," "directly electrically connected to," etc. another element, there are no intervening elements present. Spatially relative terms, such as "over," "under," "above," "below," "upper," "lower," "front," "back," "right," "left," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "below" other elements or features would then be oriented "over" or "above" the other elements or features. Thus, the exemplary term "above" may encompass both an above and below orientation.

The terms used herein are for illustrative purposes of the present invention only and should not be construed to limit the meaning or the scope of the present invention. As used in this specification, a singular form may, unless definitely indicating a particular case in terms of the context, include a plural form. Also, the expressions "comprise" and/or "comprising" used in this specification neither define the mentioned shapes, numbers, steps, actions, operations, members, elements, and/or groups of these, nor exclude the presence or addition of one or more other different shapes, numbers, steps, operations, members, elements, and/or groups of these, or addition of these. The term "and/or" used herein includes any and all combinations of one or more of the associated listed items. As used herein, terms such as "first," "second," etc. are used to describe various items. However, it is obvious that such items should not be defined by these terms. The terms are used only for distinguishing one item from another item. Thus, a first item which will be described may also refer to a second item without departing from the scope of the present invention.

As is known in the semiconductor art, there are n-type dopants (e.g., arsenic, phosphorus) that may be implanted, diffused, or grown into a semiconductor region to make it n-type, and there are p-type dopants (e.g., boron) that may be implanted, diffused, or grown into a semiconductor region to make the region p-type. In many device fabrication processes, it is common to implant or diffuse an n-type dopant into an existing p-type region to make a sub-region that is n-type. In that n-type sub-region, the concentration of n-type dopant exceeds the concentration of the p-type dopant. There is a "net" n-type doping concentration in that sub-region that is equal to the concentration of the introduced n-type dopant minus the concentration of the existing p-type dopant. A substantial portion of the electrical properties of the n-type sub-region is related to the net n-type doping concentration (rather than the concentration of the introduced n-type dopant), and for that reason the semiconductor art makes the distinction between net and introduced concentrations. Other regions of a device may be formed with only one type of dopant introduced into the regions during formation, in which case the "net" doping concentration is equal to the introduced doping concentration.

Aspects of the present invention sharply contrast with the previously described views of the prior art. The inventors recognize that, in addition to serving their primary circuit functions when operated under normal (non-breakdown) conditions, semiconductor power devices can sometimes serve useful secondary circuit functions when operated under breakdown conditions. This is generally possible if the circuit limits the current or power delivered to the device during the breakdown conditions to prevent destruction of the device. One exemplary secondary circuit function may be to limit the voltage of power spikes on a power-generating line in order to protect other devices coupled to the power line, such as sensors (while the primary circuit function for the device may be to provide a free-wheeling current path). However, the inventors recognize that the electrical characteristics of a power semiconductor device used in this manner should be controlled and stable during breakdown conditions and after repeated exposure to breakdown conditions, in order to provide predictable circuit operation. In this regard, the breakdown voltages of the above-described prior art vertical devices change significantly in value after a few exposures to the breakdown condition, and are not suitable for such circuit uses. Aspects of the present invention are provided to minimize the change in the breakdown voltage after repeated exposure to breakdown conditions, thereby enabling the power devices to provide secondary circuit functions.

FIG. 1 shows a cross-sectional view of a first exemplary semiconductor device 100 according to the present invention that is built upon a net N+ doped substrate 105. Semiconductor device 100 comprises a semiconductor layer 110 having a first surface 111 and a second surface 112, with the second surface 112 being disposed on substrate 105. Layer 110 may be formed by a conventional epitaxial deposition process. It is typically fabricated with n-type dopant grown into it, without any p-type dopant present. In that case, the "net" n-type doping concentration and the introduced n-type doping can have the same value. Semiconductor layer 110 further comprises a mesa region 120 that has a top surface adjacent to the layer's first surface 111, a width $W_M$, and a concentration $N_M$ of net doping in a center portion of mesa region 120. Width $W_M$ is measured at a location halfway up the side walls of mesa region 120 (e.g., middle of the mesa), and the net doping concentration $N_M$ is measured in an area (i.e., a portion) centered at the midpoint of the line that width $W_M$ is measured. In typical embodiments of device 100, a major portion of mesa region is uniformly doped at a net n-type concentration, with the n-type net doping concentration $N_M$ being equal to the uniformly-doped concentration. The major portion generally extends from the bottom of the mesa to a few tenths of a micron from the top of the mesa. (As explained below in greater detail, a p-type dopant may be ion-implanted at the top of mesa region 120 and diffused in a few tenths of a micron in some implementations of device 100, and so the net n-type doping concentration decreases at the top of mesa region 120.)

Mesa region 120 may be defined by one or more electrically insulated trench electrodes 130 disposed in semiconductor layer 110 adjacent to mesa region 120, and extending from the layer's first surface 111 toward the layer's second surface 112. Each trench electrode 130 comprises a center conductive electrode 132, an outer electrically insulating layer 134, side walls 136, and a bottom wall 137. Center conductive electrode 132 may comprise a metal and/or doped polysilicon. Outer insulating layer 134 may comprise an oxide, such as silicon dioxide. In an exemplary implementation, semiconductor layer 110 may have a thickness of 4.25 μm (microns), trench electrode 130 may have a depth of 1.1 μm, insulating layer 134 may comprise silicon dioxide having a thickness of 400 Angstroms, and mesa region 120 may have a width in the range of 0.2 μm to 0.6 μm, with its sidewalls being inclined at an angle of about 89 degrees with respect to the layer's second surface 112. In typical implementations, the mesa width is in the range of a width in the range of 0.2 μm to 0.4 μm, and preferably in the range of 0.25 μm to 0.35 μm. Substrate 105 may have a net n-type doping concentration of $5 \times 10^{18}$ cm$^{-3}$ to $1 \times 10^{20}$ cm$^{-3}$. The net doping concentration $N_M$ of mesa region 120 may have a value in the range of $4 \times 10^{15}$ cm$^{-3}$ to $2 \times 10^{17}$ cm$^{-3}$; it is typically in the range of $8 \times 10^{15}$ cm$^{-3}$ to $8 \times 10^{16}$ cm$^{-3}$, and is preferably about $4 \times 10^{16}$ cm$^{-3}$ or less.

Semiconductor device 100 further comprises a second electrode 140 disposed adjacent to the top surface of the mesa region 120, and a third electrode 150 electrically coupled to the n-type layer. Second electrode 140 may comprise a metal disposed on the top surface of the mesa region to provide a Schottky diode structure. Before disposing the metal for second electrode 140, a p-type dopant may be ion-implanted at the top of mesa region 120 and diffused in a few tenths of a micron to adjust the forward-bias and reverse leakage characteristics of the Schottky diode in some implementations of device 100. Third electrode 150 may comprise a backside metal contact disposed at the backside of substrate 105, and thereby electrically coupled to layer 110 through the N+ doping of substrate 105. In typical implementations, second electrode 140 is electrically coupled to trench electrode 130, either by one or more conductive layers disposed on top of semiconductor layer 110 or by an external circuit connection between the electrodes. This configuration of the electrodes provides a trench-shielded Schottky diode. It may be appreciated that the configuration of the electrodes may be changed, and that additional doped regions and electrodes can be provided at the top surface of mesa region 120 to provide a trench-shielded transistor, which may comprise a metal-oxide-semiconductor (MOS) transistor, an insulated-gate bipolar transistor (IGBT), etc., or to provide other types of rectifiers, such as junction diodes, silicon-control rectifiers (SCR), etc. In these cases, the insulated electrode 130 is electrically coupled to the source region or emitter region of the transistor/rectifier to shield these regions from reverse voltages. Accordingly, the present invention is not limited to Schottky diodes.

Figure 2:
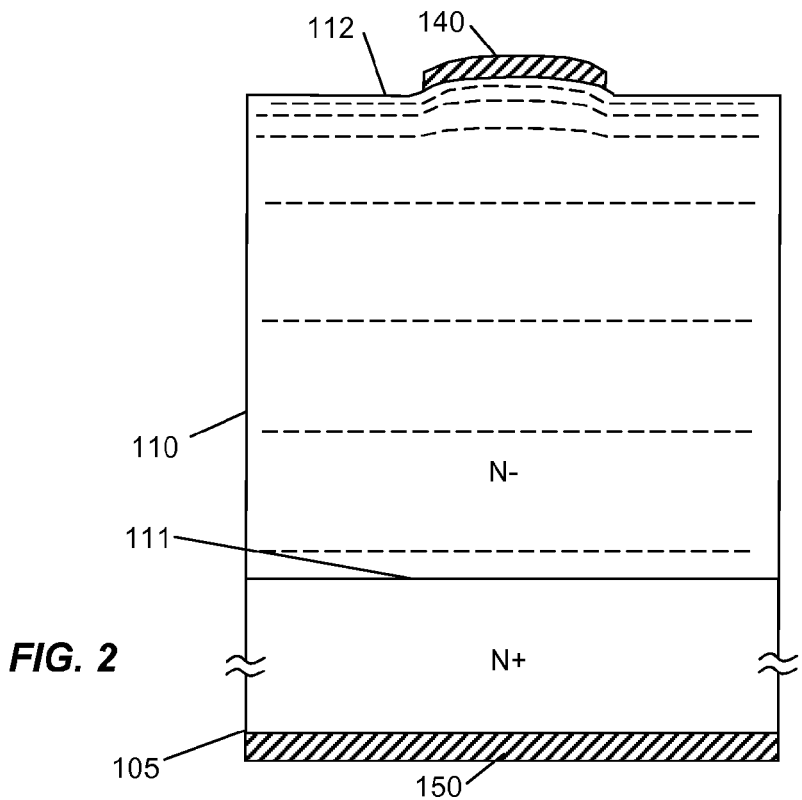
FIG. 2 is a cross sectional view showing an exemplary set of equipotential lines in an unshielded Schottky diode.
Figure 3:
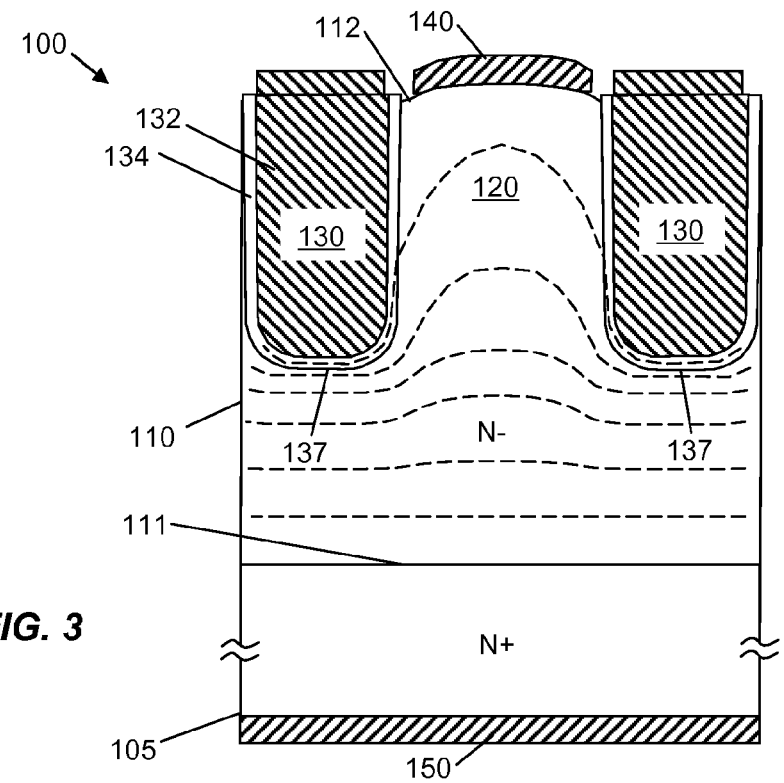
FIG. 3 is a cross sectional view showing an exemplary set of equipotential lines in a first exemplary embodiment of a semiconductor device according to the present invention.

If trench electrodes 130 were not present in device 100, a reverse voltage applied between second electrode 140 and third electrode 150 would be concentrated near the Schottky junction at second electrode 140, as shown by the exemplary set of equipotential lines in FIG. 2. Such concentration leads to large leakage currents, which are undesirable. FIG. 3 shows these same equipotential lines with trench electrodes 130 present. Instead of being concentrated near the Schottky junction, the equipotential lines are concentrated near the bottom walls 137 of the trench electrodes 130. This is because the charge in the mesa region is much less than the charge in the region under the trenches. Trench electrodes 130 also electrostatically couple potential to mesa region 120 to keep the region's potential near that of the Schottky junction. Some of the equipotential lines do extend into mesa region 120 because of the width of the mesa, but they are not concentrated at the Schottky junction and do not increase the leakage current to the same degree as the equipotential lines for the device shown in FIG. 2.

Referring to FIG. 3, if the reverse voltage is increased further, additional equipotential lines appear, and the distance between them becomes shorter. Carrier avalanche then occurs in regions of the shortest spacing of the lines (corresponding to regions of highest electric field). Carrier avalanche generally occurs near the bottom corners of trench electrodes 130, and brings the device into a breakdown condition. The avalanche process generates holes and electrons, with the holes drifting along the sides of mesa region 120 toward the Schottky junction and the electrons drifting downwards toward substrate 105.

Referring back to FIG. 1, semiconductor device 100 further comprises a product of the width $W_M$ and the net doping concentration $N_M$ of a center portion of mesa region 120 that is preferably less than about $2.4 \times 10^{12}$ cm$^{-2}$, and more preferably less than about $1.2 \times 10^{12}$ cm$^{-2}$. This feature of semiconductor device 100 minimizes the change in the device's breakdown voltage after repeated exposure to breakdown conditions, as explained below in greater detail. Conventional 20-25V trench-shielded Schottky diodes have corresponding product values that are greater than $3 \times 10^{12}$ cm$^{-2}$. This is because conventional trench-shielded devices are designed to minimize the ON-state resistance, and a product of $3 \times 10^{12}$ cm$^{-2}$ or more provides a desirable (e.g., low) ON-state resistance for many power applications.

The inventors have found that the breakdown voltage of a conventional trench-shielded Schottky diode increases with repeated exposure to breakdown conditions, sometimes as much as 5 volts or more. While such a large shift in breakdown voltage would be viewed by the prior art as being advantageous, it would be unacceptable for the secondary circuit functions described above. From various experiments and device simulations, the inventors have deduced that the increase in the breakdown voltage of the conventional trench-shielded device is caused by high-energy holes being generated during breakdown conditions and injected into the oxide insulation layer 134 at sidewall 136, where they are trapped. The high-energy holes are generated in two carrier avalanche regions located in the lower part of mesa region 120, adjacent to respective lower corners of the mesa region. The trapped holes, which have positive charges, are schematically designated by the notation "H" in FIG. 1. The trapped holes attract electrons to mesa region 120 and increase the charge within the region. The increased mesa charge causes more of the equipotential lines to extend into mesa region 120 during reversed-bias conditions, which increases the spacing distance between the lines and lowers the magnitude of the electric field. In turn, the reduced electric field increases the breakdown voltage since more reverse voltage is required to reach the high electric field that initiates the avalanche process.

With each exposure to the breakdown condition, trapped holes accumulate in layer 134 further and further up sidewalls 136 of insulated electrodes 130, provided that the external circuit controls the magnitude of reverse current and/or power to prevent destruction of the device. In response, the mesa charge increases further, and the breakdown voltage increases until a maximum shift is reached after several hundred exposures to the breakdown condition.

As part of making their invention, the inventors have discovered that keeping the product $W_M$ and $N_M$ less than about $2.4\times10^{12}$ cm$^{-2}$, and more preferably less than about $1.2\times10^{12}$ cm$^{-2}$, suppresses the extension of equipotential lines into mesa region 120, and moves the location of the carrier avalanche regions downward and below the mesa region, to locations adjacent to the lower corners of the insulated electrodes 130. The new location suppresses the injection of high-energy avalanche holes into the oxide 134 at sidewalls 136 of electrodes 130, and prevents the equipotential lines from extending further into mesa region 120 with repeated exposure to breakdown conditions. This significantly reduces the shift in breakdown voltage. Product values equal to or less than $1.0\times10^{12}$ cm$^{-2}$, and equal to or less than $0.6\times10^{12}$ cm$^{-2}$ may be used for further reduction of the shift in breakdown voltage.

While device 100 has been illustrated as an n-channel device with an n-type substrate 105, n-type semiconductor layer 110 and n-type net doping concentration $N_M$, it may be appreciated that the device may be constructed as a p-channel device with a p-type substrate 105, p-type semiconductor layer 110, and p-type net doping concentration $N_M$. Accordingly, the claims encompass these possible channel constructions by reciting that these elements are of "a first conductivity type".

Figure 4:
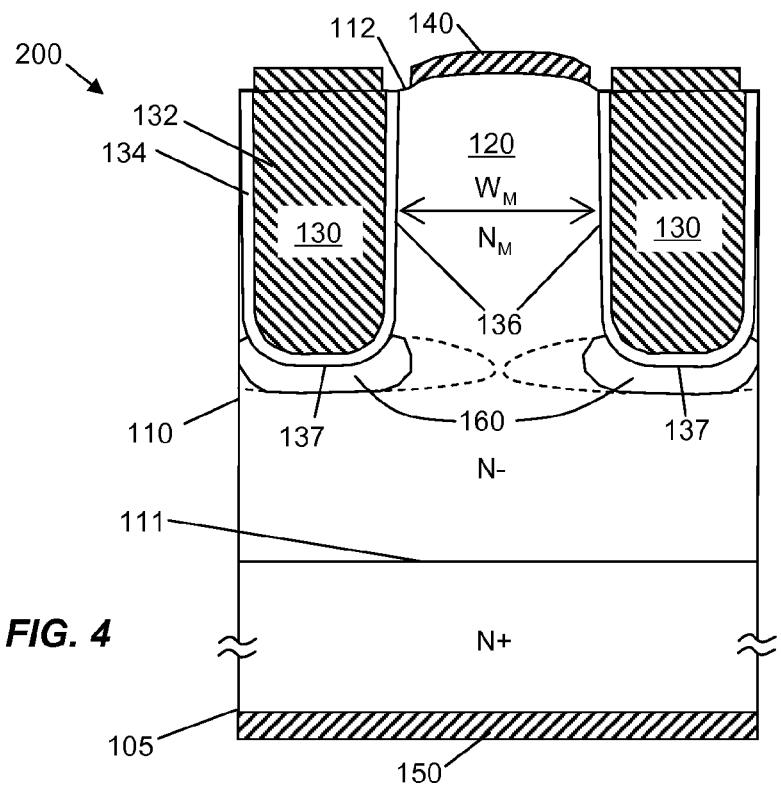
FIG. 4 is a cross sectional view of a second exemplary embodiment of a semiconductor device according to the present invention.

FIG. 4 shows a cross-sectional view of a second exemplary semiconductor device 200 according to the present invention that is built upon an N+ doped substrate 105. Semiconductor device 200 comprises the same elements 110-150 as semiconductor device 100 arranged in substantially the same way, as described above. The elements 110-150 of semiconductor device 200 may have the same properties and construction as the elements 110-150 of semiconductor device 100, as described above. As differences with device 100, semiconductor device 200 further comprises enhanced doping regions 160 disposed near the bottom walls 137 of electrodes 130, and there is no need to have a product of $W_M$ and $N_M$ that is less than about $2.4\times10^{12}$ cm$^{-2}$ (although such can be used and can be advantageous). Enhanced doping regions 160 have net peak n-type doping concentrations that are at least 50% higher that the net n-type doping concentrations of semiconductor layer 110 and mesa region 120, and typically have net peak n-type doping concentrations that are 2 to 5 times higher. Regions 160 can be readily formed by ion-implanting an n-type dopant into the bottom walls of the trenches 130 before the electrodes are formed, followed by annealing the implant. The annealing treatment can cause the dopant to migrate toward the centerline of the mesa, as indicated by the dashed lines in the figure. A typical implant dose can range from $5\times10^{12}$ cm$^{-2}$ (dopant atoms per square centimeter of implanted surface area) to $2\times10^{13}$ cm$^{-2}$, and may have an implant energy and anneal treatment that diffuses the implant 0.1 microns to 2 microns into semiconductor layer 110.

Enhanced doping regions 160 act to pin the avalanche regions to locations below mesa region 120, thereby preventing the breakdown voltage from increasing with repeated exposures of the device to breakdown conditions. They do this by increasing the charge density in semiconductor layer 110 near the bottom walls 137 of electrodes 130, which concentrates the equipotential lines in the areas of the enhanced doping regions. The concentration of the equipotential lines increases the electric field in these regions, causing the avalanche regions to be at or near the enhanced doping regions. Since the enhanced doping regions 160 are located below the bottom of mesa region 120, they prevent high-energy avalanche holes from being injected into insulator layer 134 at sidewalls 136. This significantly lessens any rise in breakdown voltage from repeated exposures to breakdown conditions. Enhanced doping regions 160 are generally effective in reducing the shift in breakdown voltage for mesa widths of about 0.4 microns and less. With larger mesa widths, however, enhanced doping regions 160 have more difficulty in suppressing the extension of the equipotential lines into mesa region 120. As a result, the avalanche regions are able to move upward into the mesa region 120, resulting in high-energy avalanche holes being injected into insulating layer 134 at sidewalls 136. However, mesa widths larger than 0.4 microns, such as up to 0.5 to 0.6 microns, can be used with success if the net n-type doping concentration $N_M$ of the mesa region 120 is lowered in value (e.g., adding a feature of device 100 to device 200 with the $W_M N_M$ product being less than or equal to any of the following values $2.4\times10^{12}$ cm$^{-2}$, $1.2\times10^{12}$ cm$^{-2}$, $1\times10^{12}$ cm$^{-2}$, $0.6\times10^{12}$ cm$^{-2}$).

Enhanced doping regions 160 also function to lower the value of the device's breakdown voltage, which can be useful in adjusting the breakdown voltage to a desired level for a given secondary circuit function, while enabling the mesa doping to be adjusted for a desired primary circuit function. For example, a semiconductor device 100 (FIG. 1) having a $W_M N_M$ product of $0.6\times10^{12}$ cm$^{-2}$ may have a breakdown voltage around 37 volts, whereas a semiconductor device 200 (FIG. 4) having the same $W_M N_M$ product may have a breakdown voltage of around 24 volts with a total implant dose of $1\times10^{13}$ cm$^{-2}$ in each enhanced doping region 160 and a diffusion depth of ~1 micron. As indicated above, enhanced doping regions 160 concentrate the equipotential lines in the areas of the enhanced doping regions, which increases the electric field in these regions compared to a device without regions 160, thereby lowering the breakdown voltage. The breakdown voltage decreases in value with increasing implant dose in a predictable manner, and may be simulated by a suitable process and device simulator. This aspect of the present invention is taught against by the prior art, which seeks to increase the breakdown voltage, not reduce it.

While device 200 has been illustrated as an n-channel device with an n-type substrate 105, n-type semiconductor layer 110, n-type net doping concentration $N_M$, and n-type enhanced doping regions 160, it may be appreciated that the device may be constructed as a p-channel device with a p-type substrate 105, p-type semiconductor layer 110, p-type net doping concentration $N_M$, and p-type enhanced doping regions 160. Accordingly, the claims encompass these possible channel constructions by reciting that these elements are of "a first conductivity type".

Figure 5:
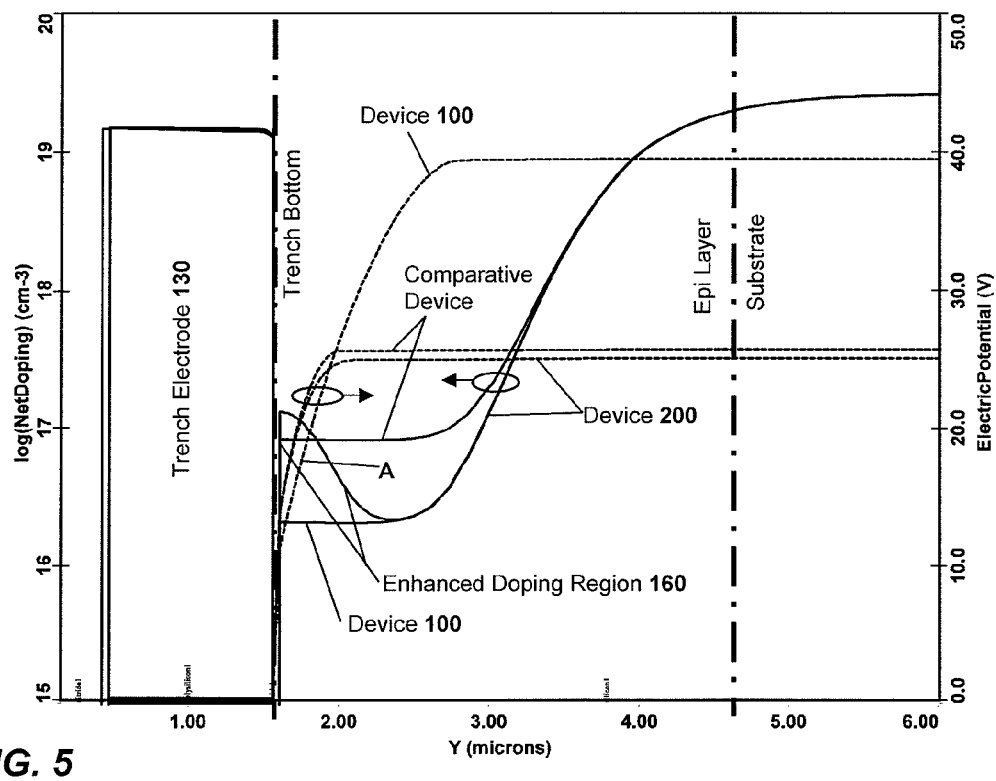
FIGS. 5 and 6 each shows a combined plot of doping concentration and simulated voltage distribution during breakdown for a comparative device and two exemplary devices according to the present invention.
Figure 6:
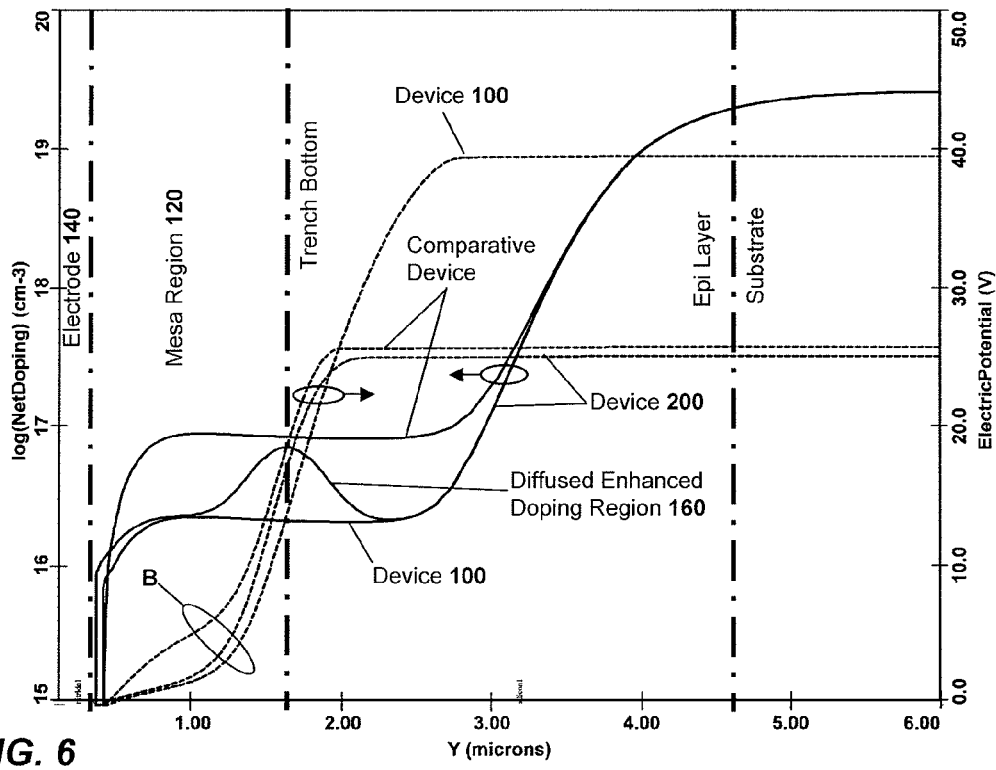

Each of FIGS. 5 and 6 shows a combined plot of doping concentration and simulated voltage distribution during breakdown for three devices: (1) a comparative device with a $W_M N_M$ product of $2.4 \times 10^{12}$ cm$^{-2}$ to delineate the lower performance bounds of device 100 (which is better than the best performance bounds of prior art devices), (2) an instance of device 100 with a $W_M N_M$ product of $0.6 \times 10^{12}$ cm$^{-2}$, and (3) an instance of device 200 with a $W_M N_M$ product of $0.6 \times 10^{12}$ cm$^{-2}$, and a total implant dose of $1 \times 10^{13}$ cm$^{-2}$ and a diffusion depth of ~1 micron for each enhanced doping region 160. In all three devices, the mesa width is 0.3 microns. The data shown in FIG. 5 is taken along a vertical line passing through the middle of trench electrode 130, and the data shown in FIG. 6 is taken along a vertical line passing through the middle of mesa region 120. The horizontal axis of each plot is the distance Y along the vertical line, with Y=0 being at the top surface of the device, and Y=6.00 being within the substrate 105. The locations of the trench bottom wall 137 and surface 111 of semiconductor layer 110 are indicated by dashed lines. Net n-type doping concentrations are shown by solid lines, with the scale being shown in logarithmic form at the left side of the plot. Voltage distributions at breakdown (with substantial avalanche current flow) are shown by dashed lines, with the scale being shown in linear form at the right side of the plot.

The doping distributions (solid lines) are discussed first. Due to thermal processing during manufacturing, a portion of substrate 105's dopant diffuses a few microns into layer 110, as shown in both FIGS. 5 and 6, and a portion of enhanced doping region 160 diffuses into mesa region 120, as shown in FIG. 6. In all three devices, a p-type dopant is implanted at the top surface of mesa regions 120 to adjust the electrical characteristics of the Schottky diodes, which causes the net n-type doping concentrations to drop toward zero near Y=0.3 in FIG. 6. As to the potential distributions (dashed lines), the Schottky electrode 140 is grounded at zero volts (left side of the plot of FIG. 6), while a reverse-bias voltage (positive voltage) is applied to substrate 105 via the third electrode 150 (right side of the plots). Device 100 has a breakdown voltage of around 40 V, whereas device 200 and the comparative device have breakdown voltages of around 25 V. The avalanche regions occur in the steep portions of the potential curve under trench electrode (FIG. 5) and to the side thereof. As seen at point "A" in FIG. 5, the steep portion for device 100 is shifted to the right with respect to the comparative device, indicating that the avalanche region has been moved downward toward substrate 105 with the reduced value of the $W_M N_M$ product. The same shift can be seen in FIG. 6. To a lesser degree, the corresponding steep portion for device 200 is also shifted to the right. As seen at point "B" in FIG. 6, the voltage distributions for devices 100 and 200 in mesa region 120 are significantly lower than that for the comparative device. This lowering acts to move the avalanche regions away from mesa region 120. The voltage distributions in the mesa regions for prior art devices would be higher than that of the comparative device.

Figure 7:
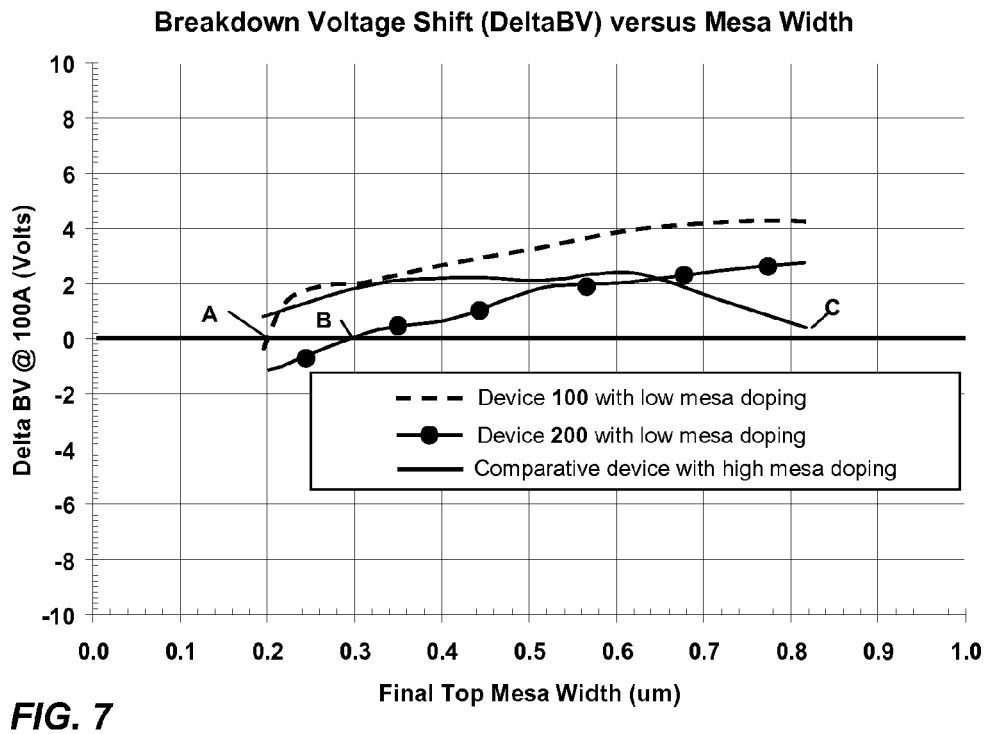
FIG. 7 shows simulation results of the shift in breakdown voltage for a comparative device and two exemplary devices according to the present invention.
Figure 8:
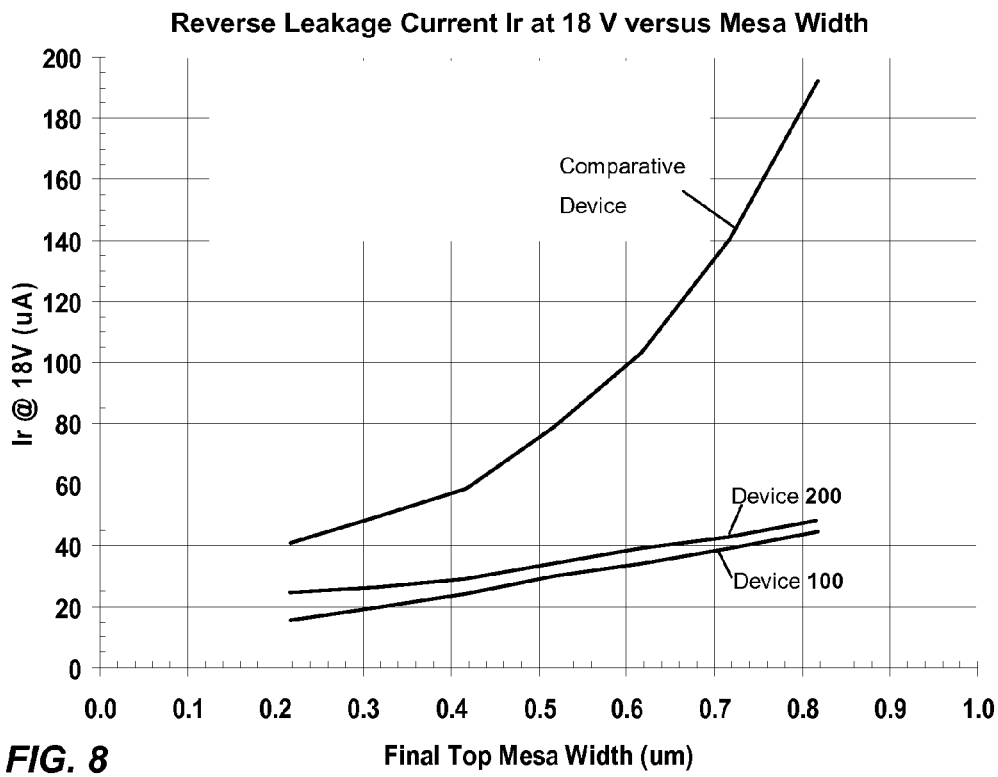
FIG. 8 shows simulation results of the reverse leakage current for a comparative device and two exemplary devices according to the present invention.

FIG. 7 shows simulation results of the shifts in breakdown voltage after several hundred exposures to the breakdown condition for the above three devices, plotted as a function of mesa width from 0.2 microns to 0.8 microns. Device 100 has substantially zero shift in a narrow region around 0.2 microns (point "A" in the figure), but quickly increases to shift of 2V at a mesa width of 0.3 microns, and 4 V at a mesa width of 0.6 microns. Device 200 has substantially zero shift in a broader region around 0.3 microns (point "B" in the figure), and reaches a maximum shift of 2.5 V at a mesa width of 0.8 microns. The comparative device experiences a 2 V shift over much of the range. Actual prior art devices have significantly worse performance than that of the comparative device, having voltage shifts of more than 2 V over the range shown in the figure. The shift in the comparative device begins to lessen around a mesa width of 0.8 microns (point "C" in the figure). However, as shown in the simulation results of FIG. 8, the comparative device has an unacceptably high leakage current at that value of mesa width, and would not be manufactured at that mesa width. On the other hand, devices 100 and 200 made with mesa widths in the range of 0.2 microns to 0.4 microns have suitably low leakage currents. Accordingly, device 100 (with a $W_M N_M$ product of less than $2.4 \times 10^{12}$ cm$^{-2}$) and device 200 enable the construction of Schottky barrier diodes with low leakage current and low shifts in breakdown-voltage. Furthermore, device 200 has a broader width of mesa width for providing low breakdown-voltage shift, and allows the value of the breakdown voltage to be adjusted.

While device 200 has been illustrated with enhanced doping regions 160 being disposed on the left and right sides of mesa region 120, it may be appreciated that device 200 may be constructed with only one enhanced doping region 160 on one side of mesa region 120.

Figure 9:
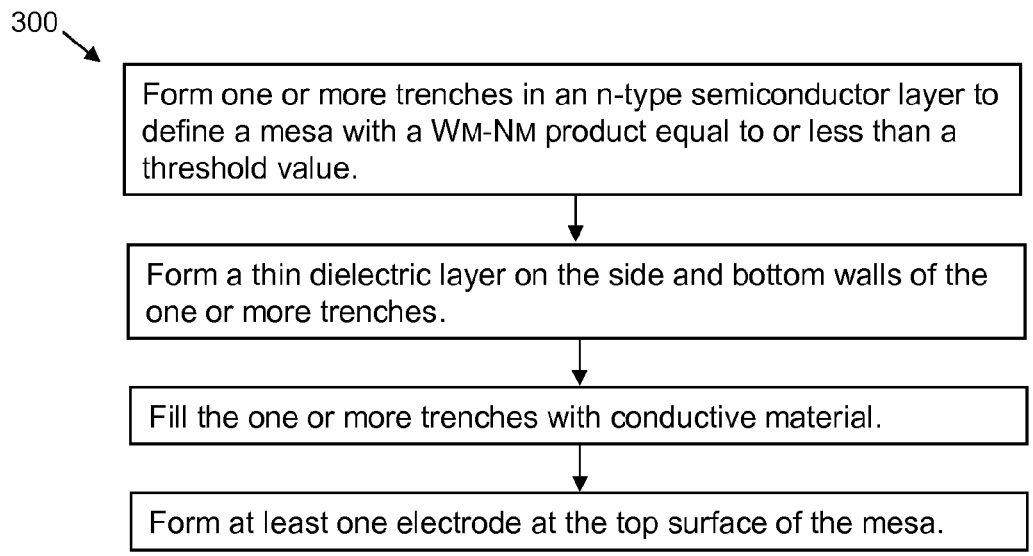
FIG. 9 is a flow diagram illustrating an exemplary method of manufacturing a semiconductor device illustrated in FIG. 1 according to the present invention.

Methods of manufacturing devices 100 and 200 are now described. Referring to FIG. 9, an exemplary method 300 for manufacturing device 100 comprises forming one or more trenches in a low-doped semiconductor layer of a first conductivity type to define a mesa having a width $W_M$ preferably equal to or less than 0.4 microns, forming a thin dielectric layer on the side and bottom walls of the one or more trenches, filling the one or more trenches with conductive material, and forming at least one electrode at the top surface of the mesa. The one or more trenches may be formed by disposing an etch mask over the semiconductor layer to protect the mesa location, and then performing an anisotropic etching process through the etch mask. The anisotropic etching process may comprise a plasma etching process. If a plasma etch is used, it may be followed by an isotropic etch of the trench side and bottom walls, which can remove any crystal damage caused by the plasma etching process. The prior etch mask may be left in place, and any known chemical etchant for silicon may be used (an isotropic aqueous chemical etchant may be used). As an alternative to this, or in addition to this, a sacrificial silicon dioxide layer may be grown and thereafter removed by a suitable etchant (an isotropic aqueous chemical etchant may be used). The thin dielectric layer may comprise silicon dioxide, and may be formed by a conventional oxidation process. The conductive material disposed in the one or more trenches may comprise a doped polysilicon material; either n-type or p-type doped polysilicon may be used, with p-type providing a better work function for shielding the mesas. The low-doped semiconductor layer may have a net dopant concentration of $N_M$ in a center portion of the mesa region that is equal to or less than $8 \times 10^{16}$ cm$^{-3}$, and preferably equal to or less than $4 \times 10^{16}$ cm$^{-3}$, with the $W_M N_M$ product being equal to or less than $2.4 \times 10^{12}$ cm$^{-2}$, and preferably equal to or less than $1.2 \times 10^{12}$ cm$^{-2}$.

Figure 10:
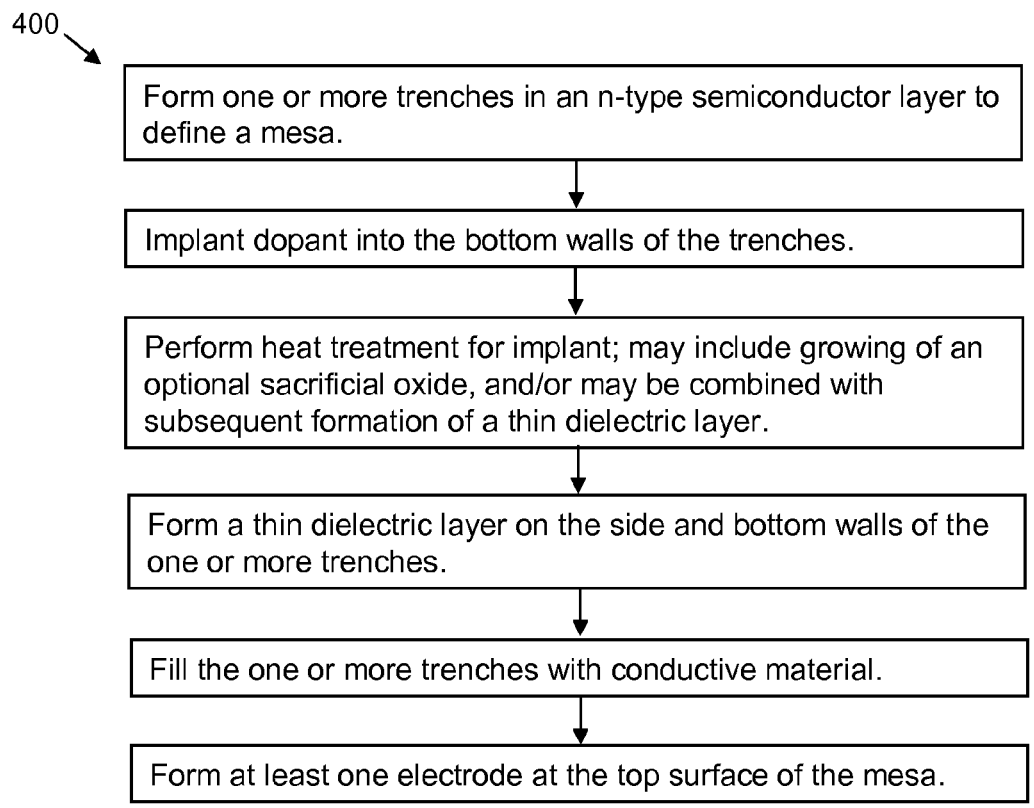
FIG. 10 is a flow diagram illustrating an exemplary method of manufacturing a semiconductor device illustrated in FIG. 4 according to the present invention.

Referring to FIG. 10, a first exemplary method 400 for manufacturing device 200 comprises forming one or more trenches into semiconductor layer of a first conductivity type to define a mesa having a width $W_M$. The one or more trenches may be formed by disposing an etch mask over the semiconductor layer to protect the mesa location, and then performing an anisotropic etching process through the etch mask. The anisotropic etching process may comprise a plasma etching process. If a plasma etch is used, an optional isotropic etch of the trench side and bottom walls may be performed to remove any crystal damage caused by the plasma etching process (an isotropic aqueous chemical etchant may be used). The prior etch mask may be left in place, and any known chemical etchant for silicon may be used (an isotropic aqueous chemical etchant may be used). Next, a dopant of the first conductivity type is ion-implanted into the bottom walls of the trenches to provide the starting doping for enhanced doping regions 160. Arsenic (As) may be used for the implanted dopant, and the prior etch mask may be left in place to prevent dopant from being implanted at the top surface of the mesa. A heat treatment process is performed to diffuse the implant into semiconductor layer 110 to activate the dopant and to provide enhanced doping regions 160. This heat treatment process may comprise growing a sacrificial oxide layer to reduce crystal damage caused by plasma etching; the sacrificial oxide may have a thickness in the range of 100 to 300 Angstroms. If a sacrificial oxide layer is grown, it is removed after the heat treatment process by a chemical etchant suitable for removing silicon dioxide. Several such etchants are known to the art. The heat treatment process may also be combined with and/or provided by another process, such as a process of forming a thin dielectric layer on the trench walls, which is described below.

Method 400 further comprises forming a thin dielectric layer on the side and bottom walls of the one or more trenches, filling the one or more trenches with conductive material, removing the etch mask on top of the mesa region, and forming at least one electrode at the top surface of the mesa. The thin dielectric layer may comprise silicon dioxide, and may be formed by a conventional oxidation process. The conductive material disposed in the one or more trenches may comprise doped polysilicon material; either n-type or p-type doped polysilicon may be used, with p-type providing a better work function for shielding the mesas. In some implementations, the semiconductor layer may have a net dopant concentration of $N_M$ in the mesa region that is equal to or less than $8 \times 10^{16}$ cm$^{-3}$, and preferably equal to or less than $4 \times 10^{16}$ cm$^{-3}$, with the $W_M N_M$ product being equal to or less than $2.4 \times 10^{12}$ cm$^{-2}$, and preferably equal to or less than $1.2 \times 10^{12}$ cm$^{-2}$.

Figure 11:
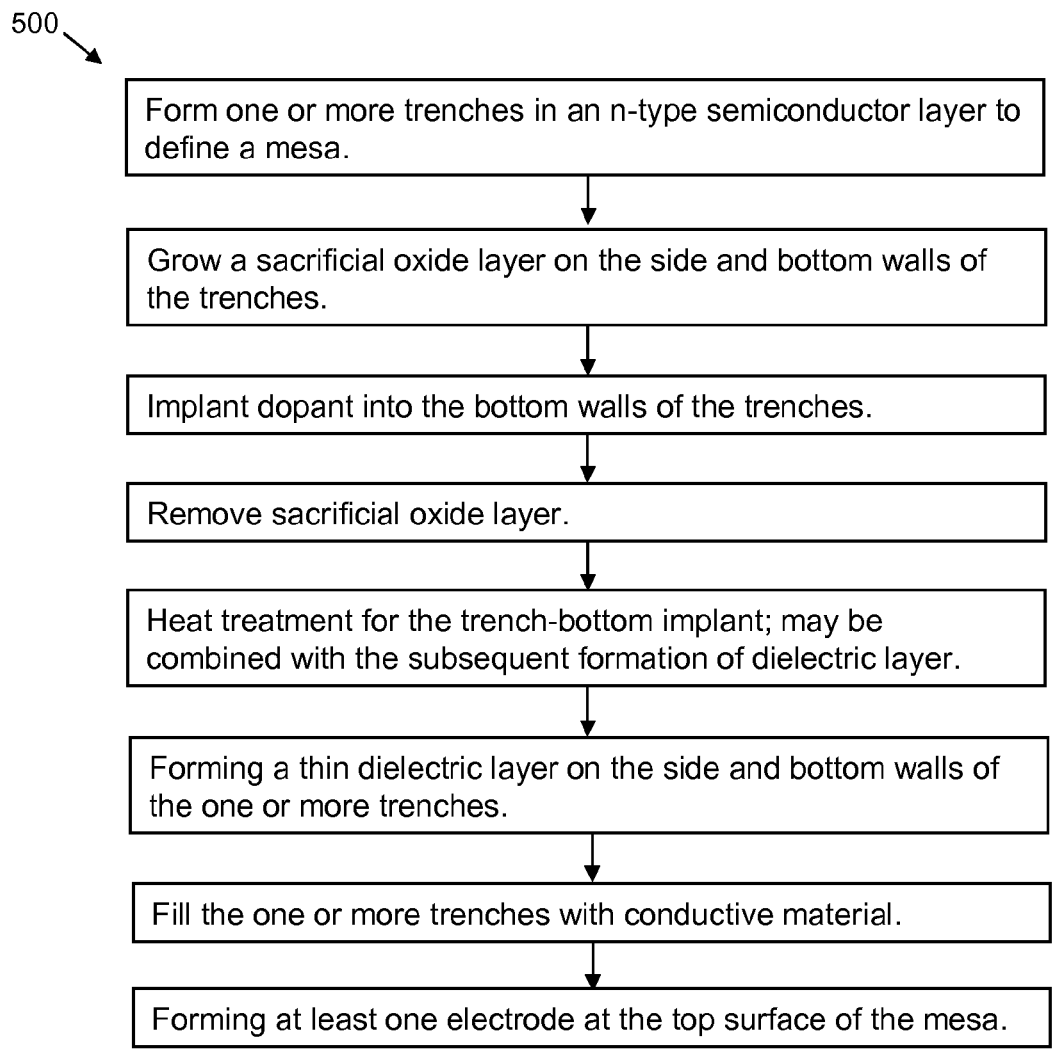
FIG. 11 is a flow diagram illustrating another exemplary method of manufacturing a semiconductor device illustrated in FIG. 4 according to the present invention.

Referring to FIG. 11, a second exemplary method 500 for manufacturing device 200 comprises forming one or more trenches into a semiconductor layer of a first conductivity type to define a mesa having a width $W_M$. The one or more trenches may be formed by disposing an etch mask over the semiconductor layer to protect the mesa location, and then performing an anisotropic etching process through the etch mask. The anisotropic etching process may comprise a plasma etching process. An optional isotropic etch of the trench side and bottom walls may be performed to remove any crystal damage caused by the plasma etching process. The prior etch mask may be left in place, and any known chemical etchant for silicon may be used (an isotropic aqueous chemical etchant may be used). The method further comprises growing a sacrificial oxide layer on the side and bottom walls of the trenches, followed by ion-implanting a dopant of the first conductivity type into the bottom walls of the trenches to provide the starting doping for enhanced doping regions 160. The sacrificial oxide may have a thickness in the range of 100 to 300 Angstroms; it reduces crystal damage caused by any plasma etching, and absorbs any dopant atoms hitting the mesa side walls during ion-implantation. Arsenic (As) may be used for the implanted dopant, and the prior etch mask may be left in place to prevent dopant from being implanted at the top surface of the mesa. After ion-implantation, the sacrificial oxide is removed by an etchant suitable for removing silicon dioxide. A thermal heat treatment process may be performed to diffuse the implant into semiconductor layer 110 to activate the dopant and to provide enhanced doping regions 160. The thermal heat treatment process may be combined with and/or provided by another process, such as a process of forming a thin dielectric layer on the side and bottom walls of the one or more trenches, such as by thermal oxidation to form a silicon dioxide layer.

Method 500 further comprises filling the one or more trenches with conductive material, removing the etch mask on top of the mesa region, and forming at least one electrode at the top surface of the mesa. The conductive material disposed in the one or more trenches may comprise a doped polysilicon material; either n-type or p-type doped polysilicon may be used, with p-type providing a better work function for shielding the mesas. In some implementations, the semiconductor layer may have a net dopant concentration of $N_M$ of the first conductivity type in the mesa region that is equal to or less than $8 \times 10^{16}$ cm$^{-3}$, and preferably equal to or less than $4 \times 10^{16}$ cm$^{-3}$, with the $W_M N_M$ product being equal to or less than $2.4 \times 10^{12}$ cm$^{-2}$, and preferably equal to or less than $1.2 \times 10^{12}$ cm$^{-2}$.

Additional actions may be added to any of the above methods to manufacture trench-shielded transistors or other types of trench-shielded rectifiers.

It should be understood that where the performance of an action of any of the methods disclosed and claimed herein is not predicated on the completion of another action, the actions may be performed in any time sequence (e.g., time order) with respect to one another, including simultaneous performance and interleaved performance of various actions. (Interleaved performance may, for example, occur when parts of two or more actions are performed in a mixed fashion.) For example, in each of the methods, an electrode may be formed at the top surface of the mesa before the one or more trenches are formed; and in method 500, the sacrificial oxide may be removed after the heat treatment for the trench-bottom implant. Accordingly, it may be appreciated that, while the method claims of the present application recite sets of actions, the method claims are not limited to the order of the actions listed in the claim language, but instead cover all of the above possible orderings, including simultaneous and interleaving performance of actions and other possible orderings not explicitly described above, unless otherwise specified by the claim language (such as by explicitly stating that one action precedes or follows another action).

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

While the various embodiments of the inventions are mostly described in the context of N-channel trench shielded devices, embodiments according to the present invention may be implemented in as P-channel trench-shielded devices where the conductivity types of the layers and regions are reversed. Moreover, while the embodiments have been illustrated using Schottky barrier rectifiers, embodiments according to the present invention may be implemented with MOS- FET structures, IGBT structures, BJT structures, shielded gate synchronous rectifiers (e.g., integrated shielded gate MOSFET and Schottky), and superjunction variations of the devices described herein (e.g., devices with columns of alternating conductivity type silicon).

Moreover, one or more features of one or more embodiments of the inventions may be combined with one or more features of other embodiments of the invention without departing from the scope of the invention.

While the present invention has been particularly described with respect to the illustrated embodiments, it will be appreciated that various alterations, modifications, adaptations, and equivalent arrangements may be made based on the present disclosure (e.g., various changes may be made and equivalents may be substituted for elements thereof to adapt to particular situations), and are intended to be within the scope of the invention and the appended claims.

What is claimed is:

1. A semiconductor device, comprising:
 a semiconductor layer of a first conductivity type having a first surface, a second surface, and a mesa region, the mesa region having a top surface adjacent to the layer's first surface, a width, and a net doping concentration of the first conductivity type in a center portion of the mesa region;
 an electrically insulated electrode disposed in the semiconductor layer and adjacent to the mesa region, the electrically insulated electrode extending from the layer's first surface toward the layer's second surface, and having at least one side wall and a bottom wall;
 a second electrode disposed adjacent to the top surface of the mesa region;
 a third electrode electrically coupled to the semiconductor layer; and
 wherein a product of the width and the net doping concentration in the center portion of the mesa region is equal to or less than $2.4 \times 10^{12}$ cm$^{-2}$.

2. The semiconductor device of claim 1 wherein the product of the width and the net doping concentration in the center portion of the mesa region is equal to or less than $1.2 \times 10^{12}$ cm$^{-2}$.

3. The semiconductor device of claim 1 wherein the net doping concentration in the center portion of the mesa region is equal to or less $8 \times 10^{16}$ cm$^{-3}$.

4. The semiconductor device of claim 1 wherein the first conductivity type is n-type.

5. The semiconductor device of claim 1 wherein the electrically insulated electrode comprises a central conductive body and an outer electrically insulating layer disposed on the central conductive body.

6. The semiconductor device of claim 1 wherein the second electrode is disposed to provide a Schottky diode with the mesa region, and wherein the second electrode is electrically coupled to the electrically insulated electrode.

7. The semiconductor device of claim 1 wherein the width of the mesa region is equal to or less than 0.4 microns.

8. The semiconductor device of claim 1, wherein the electrically insulated electrode comprises an electrically-conductive electrode having at least one side wall that is uniformly spaced from the mesa region along its at least one side wall.

9. The semiconductor device of claim 5 wherein the outer electrically insulating layer comprises silicon dioxide and the central conductive body comprises polysilicon.

10. A semiconductor device, comprising:
 a semiconductor layer of a first conductivity type having a first surface, a second surface, a mesa region, and a first net doping concentration of the first conductivity type in a center portion of the mesa region, the mesa region having a top surface adjacent to the layer's first surface;
 an electrically insulated electrode disposed in the semiconductor layer and adjacent to the mesa region, the electrically insulated electrode extending from the layer's first surface toward the layer's second surface, and having at least one side wall and a bottom wall;
 a second electrode disposed adjacent to the top surface of the mesa region;
 a third electrode electrically coupled to the semiconductor layer; and
 an enhanced doping region disposed in the semiconductor layer having a second net doping concentration of the first conductivity type that is greater than the first net doping concentration of the first conductivity type, the enhanced doping region being disposed adjacent to the bottom wall of the electrically insulated electrode.

11. The semiconductor device of claim 10 wherein the semiconductor layer comprises silicon.

12. The semiconductor device of claim 10 wherein the electrically insulated electrode comprises a central conductive body and an outer electrically insulating layer disposed on the central conductive body.

13. The semiconductor device of claim 10 wherein the second electrode is disposed to provide a Schottky diode with the mesa region.

14. The semiconductor device of claim 10 wherein the second net doping concentration is greater than the first net doping concentration by at least an amount of $2 \times 10^{16}$ cm$^{-3}$.

15. The semiconductor device of claim 10 wherein the enhanced doping region extends from the bottom wall of the electrically insulated electrode toward the second surface of the semiconductor layer to a point that is 0.1 microns to 2 microns from the bottom wall.

16. The semiconductor device of claim 10 wherein the mesa region has a width that is equal to or less than 0.6 microns.

17. The semiconductor device of claim 10 wherein the mesa region has a width that is equal to or less than 0.4 microns.

18. The semiconductor device of claim 10 wherein the mesa region has a width, and wherein a product of the width and the first net doping concentration is equal to or less than $2.4 \times 10^{12}$ cm$^{-2}$.

19. The semiconductor device of claim 10 wherein the net doping concentration in the center portion of the mesa region is equal to or less than $8 \times 10^{16}$ cm$^{-3}$.

20. The semiconductor device of claim 10 wherein the first conductivity type is n-type.

21. The semiconductor device of claim 10, wherein the electrically insulated electrode comprises an electrically-conductive electrode having at least one side wall that is uniformly spaced from the mesa region along its at least one side wall.

22. The semiconductor device of claim 10, wherein a portion of the enhanced doping region having the second net doping concentration of the first conductivity type abuts a portion of the semiconductor layer having the first net doping concentration of the first conductivity type.

23. The semiconductor device of claim 12 wherein the electrically insulating layer comprises silicon dioxide.

24. The semiconductor device of claim 12 wherein the central conductive body comprises polysilicon.

25. The semiconductor device of claim 18 wherein the product of the width and the first net doping concentration in the center portion of the mesa region is equal to or less than $1.2 \times 10^{12}$ cm$^{-2}$.

26. The semiconductor device of claim 13 wherein the second electrode is electrically coupled to the electrically insulated electrode.

27. A method of manufacturing a semiconductor device, the method comprising:
- forming one or more trenches into a semiconductor layer of a first conductivity type to define a mesa region having a width, the semiconductor layer having a first surface and a second surface, the mesa region having a top surface adjacent to the layer's first surface and a net dopant concentration of a first conductivity type in a center portion of the mesa region, a product of the width and the net dopant concentration being equal to or less than $2.4 \times 10^{12}$ cm$^{-2}$;
- forming a dielectric layer on the side and bottom walls of the one or more trenches;
- filling the one or more trenches with conductive material to form an electrically insulated electrode disposed in the semiconductor layer and adjacent to the mesa region, the electrically insulated electrode extending from the layer's first surface toward the layer's second surface, and having at least one side wall and a bottom wall;
- forming a second electrode that is disposed adjacent to the top surface of the mesa region; and
- forming a third electrode electrically coupled to the semiconductor layer.

28. The method of claim 27 wherein the net dopant concentration of the first conductivity type is equal to or less than $8 \times 10^{16}$ cm$^{-3}$.

29. The method of claim 27 wherein the width of the mesa region is equal to or less than 0.4 microns.

30. The method of claim 27 wherein forming the one or more trenches comprises:
- disposing an etch mask over the semiconductor layer to protect a location for the mesa region and to leave one or more exposed portions of the semiconductor layer;
- etching the one or more exposed portions of the semiconductor layer to form one or more initial trenches, the one or more initial trenches having a plurality of surfaces, the etching comprising an anisotropic etching process;
- growing a sacrificial oxide on the surfaces of the one or more initial trenches; and
- removing the sacrificial oxide.

31. A method of manufacturing a semiconductor device, the method comprising:
- forming one or more trenches into a semiconductor layer of a first conductivity type to define a mesa region having a width, the semiconductor layer having a first surface, a second surface, and a first net concentration of the first conductivity type in a center portion of the mesa region, the mesa region having a top surface adjacent to the layer's first surface, each trench having a bottom wall and one or more side walls;
- implanting a dopant of the first conductivity type into the semiconductor layer at a location of a bottom wall of at least one trench to form an enhanced doping region disposed in the semiconductor layer having a second net doping concentration of the first conductivity type that is greater than the first net doping concentration of the first conductivity type;
- forming a dielectric layer on the side and bottom walls of the one or more trenches;
- filling the one or more trenches with electrically conductive material to form at least one electrically insulated electrode disposed in the semiconductor layer and adjacent to the mesa region, the at least one electrically insulated electrode extending from the layer's first surface toward the layer's second surface, and having at least one side wall and a bottom wall, the enhanced doping region being disposed adjacent to the bottom wall of the at least one electrically insulated electrode;
- forming a second electrode that is disposed adjacent to the top surface of the mesa region; and
- forming a third electrode electrically coupled to the semiconductor layer.

32. The method of claim 31 further comprising:
- after implanting the dopant, growing a sacrificial oxide on the walls of the one or more trenches; and
- removing the sacrificial oxide before forming the dielectric layer.

33. The method of claim 31 further comprising:
- growing a sacrificial oxide on the walls of the one or more trenches before implanting the dopant; and
- removing the sacrificial oxide after implanting the dopant.

34. The method of claim 31 wherein forming the one or more trenches comprises:
- disposing an etch mask over the semiconductor layer to protect a location for the mesa region and to leave one or more exposed portions of the semiconductor layer;
- etching the one or more exposed portions of the semiconductor layer to form one or more initial trenches having a plurality of walls, the etching comprising an anisotropic etching process; and
- exposing the walls of the initial trenches to an isotropic etchant.

35. The method of claim 31 wherein a product of the width of the mesa region and the first net dopant concentration is equal to or less than $2.4 \times 10^{12}$ cm$^{-2}$.

* * * * *